（12） United States Patent
Tanaka et al.

(10) Patent No.: US 6,191,647 B1
(45) Date of Patent: Feb. 20, 2001

(54) LOW NOISE INTEGRATED CIRCUIT DEVICE FOR REDUCING A NOISE ON LSI POWER SUPPLY NETS TO SUPPLY ELECTRIC CHARGES REQUIRED TO OPERATE IC

(75) Inventors: Katsuya Tanaka, Kokubunji; Masayoshi Yagyu, Hanno; Tatsuya Saito, Hachioji; Tetsuya Uemura, Sayama; Tomohisa Iwanaga, Ebina; Hiroki Yamashita, Hachioji; Takeshi Kato, Akishima, all of (JP)

(73) Assignee: Hitachi, Ltd., Tokyo (JP)

( * ) Notice: Under 35 U.S.C. 154(b), the term of this patent shall be extended for 0 days.

(21) Appl. No.: 09/220,372

(22) Filed: Dec. 24, 1998

(30) Foreign Application Priority Data

Dec. 26, 1997 (JP) ...................................... 9-359260

(51) Int. Cl.[7] ...................................... H03K 5/00
(52) U.S. Cl. ........................ 327/551; 327/532; 327/552
(58) Field of Search ..................... 327/531, 532, 327/555, 551, 552, 331

(56) References Cited

U.S. PATENT DOCUMENTS 5,972,553 * 10/1999 Kim ...................................... 327/551

OTHER PUBLICATIONS

H. Schettler et al, "A CMOS Mainframe Processor with 0.5um Channel Length", IEEE Journal of Solid–State Circuits, vol. 25, No. 5, Oct. 1990, pp. 1166–1177.

* cited by examiner

Primary Examiner—Dinh T. Le
(74) Attorney, Agent, or Firm—Mattingly, Stanger & Malur, P.C.

(57) ABSTRACT

A condenser having a huge area is required to reduce a noise on LSI power supply nets ($-\Delta VDD$) of an integrated circuit because a bypass condenser can only utilize a part of accumulated electric charges. A noise of LSI power supply nets is suppressed by generating a noise of a reversed polarity ($+\Delta VDD$) to the noise on the LSI power supply nets ($-\Delta VDD$), based upon a noise reducing circuit discharging a condenser charged with a high voltage. A noise reduction effect equivalent to a bypass condenser having a large capacity is obtained even when a condenser having a small capacity is used.

10 Claims, 11 Drawing Sheets

LOW NOISE INTEGRATED CIRCUIT DEVICE FOR REDUCING A NOISE ON LSI POWER SUPPLY NETS TO SUPPLY ELECTRIC CHARGES REQUIRED TO OPERATE IC

BACKGROUND OF THE INVENTION

1. Field of the Invention

The present invention relates to an integrated circuit device reducing a noise on LSI power supply nets followed by a high speed operation. More specifically, the present invention relates to a low noise integrated circuit device including a semiconductor (e.g., CMOS), in which a power supply current flows during only a specified period of time.

2. Description of the Related Art

Followed by a high speed operation and a high integration of a semiconductor integrated circuit, a power supply current required by the integrated circuit device, particularly, simultaneous switching current, has been increasing. There is a problem that a noise occurs on LSI power supply nets, caused by resistance and inductance of power supply wiring that has to be fine to supply an electric power to the integrated circuit. Generally, a bypass condenser is used to reduce the noise on LSI power supply nets. FIG. 11 shows a noise reducing method using the bypass condenser on LSI power supply nets. An integrated circuit 110 is connected to a power supply VDD at a connection point N5 and connected to a power supply VSS at a connection point N6. An impedance 111 exists in a wiring between the power supply VDD and the connection point N5. An impedance of a wiring between the power supply VSS and the connection point N6 can be ignored because of its small value. When the integrated circuit 100 includes a logic integrated circuit with a plurality of gates that perform a simultaneous turn-on and off, a power supply current of the integrated circuit 110 has quick rise-up and down characteristics and for instance, becomes a pulse current flowing in synchronism with a clock signal. At this time, a noise L di/dt occurs dues to an inductance component of the impedance 111. Accordingly, to reduce the noise on LSI power supply nets, the power supply current is bypassed by connecting a condenser 112 between the connection points N5 and N6. Prior art relating to this kind of bypass condenser is described, for instance, in page 1166 to 1177 of IEEE JOURNAL OF SOLID-STATE CIRCUITS, VOL. 25, NO. 5 OCTOBER 1990.

SUMMARY OF THE INVENTION

A capacity of a bypass condenser mounted for the integrated circuit is limited in a highly integrated circuit device. While the bypass condenser discharges accumulated electric charges and supplies the electric charges to the integrated circuit, the discharge is followed by a voltage drop. When a capacity of the condenser 112 is C and an amount of electric charges of supply is Q in FIG. 11, a bypass of the power supply current is followed by a voltage drop of $\Delta N=Q/C$. In other words, if a capacity of the bypass condenser becomes short because of the limit of mounting density in the integrated circuit device and electric charges supplied from a power supply becomes short due to an influence of resistance and inductance, a power supply voltage supplied to the integrated circuit drops. Thus, if an amount of a noise on LSI power supply nets is $\Delta V$, the bypass condenser can only supply an amount of electric charges of $Q=C\Delta V$ to the integrated circuit. Therefore, there is a problem that a bypass condenser having a huge area is required to reduce a noise on LSI power supply nets because a part of the total amount of electric charges CV stored in the bypass condenser can only be supplied to the integrated circuit.

There is another problem following a high speed operation of an integrated circuit. FIG. 12 shows an example of noise on LSI power supply nets occurring in a semiconductor chip. Assuming that a noise on LSI power supply nets an $\Delta VA$ occurs in an area A on the chip, an amplitude of the noise on LSI power supply nets becomes $\Delta VB$ ($\Delta VA >> \Delta VB$) in an area B isolated from the area A because the noise on LSI power supply nets diminishes promptly over a distance with respect to a switching time of the integrated circuit being fast. Assuming that a bypass condenser (having a capacity of C) to reduce a noise on LSI power supply nets occurring in the area A is placed in the area B, the bypass condenser can only supply electric charges of $C\Delta VB$ to the integrated circuit and there is no time to reduce a noise on LSI power supply nets occurring in the area A for the purpose of propagation delay from the area B to the area A. In other words, it is required to place the bypass condenser in the vicinity of a source of the noise.

However, there is a problem that the bypass condenser is required to be placed onto the whole area of the chip and that causes an increase of the chip area since a source generating the noise is distributed into a whole area of the chip in an actual integrated circuit.

An object of the present invention is therefore to provide a low noise integrated circuit device reducing a noise on LSI power supply nets and further concretely, further objects are the following (1) to (11).

(1) Reducing the noise on LSI power supply nets occurring in an arbitrary place including a location in a semiconductor chip.

(2) Predicting an occurrence of the noise on LSI power supply nets and reducing it.

(3) Regulating an amount of electric charges supplied to the integrated circuit by the respective noise reducing means for reducing a noise occurring locally.

(4) Supplying a required and/or enough amount of electric charges for reducing the noise on LSI power supply nets to the integrated circuit, even if a capacity of a condenser is small.

(5) Supplying a required and/or an enough amount of electric charges for reducing the noise on LSI power supply nets to the integrated circuit, even if a capacity of a condenser is small and a power supply voltage supplied to the integrated circuit device has one kind.

(6) Supplying a required and/or an enough amount of electric charges for reducing the noise on LSI power supply nets to a positive and negative power supply of the integrated circuit, even if a capacity of a condenser is small.

(7) Preparing a condenser able to charge with a higher voltage than a positive power supply voltage of the integrated circuit.

(8) Preparing a noise reducing means having the least leakage current.

(9) Preparing a noise reducing means on LSI power supply nets having means for determining an amount of electric charges supplied to the integrated circuit.

(10) Preparing means able to measure a noise voltage on LSI power supply nets occurred in the positive power supply of the integrated circuit.

(11) Preparing a noise measuring means having a high precision on LSI power supply nets.

BRIEF DESCRIPTION OF THE DRAWINGS

The embodiments of the present invention are described below in conjunction with the figures, in which.

DESCRIPTION OF THE PREFERRED EMBODIMENT

A description will be given of the present invention embodiments by reference to the accompanying drawings.

An equation (1) is given as follows, described as A bar and meant for an inverting signal of a signal A.

$$\bar{A} \tag{1}$$

Figure 1:
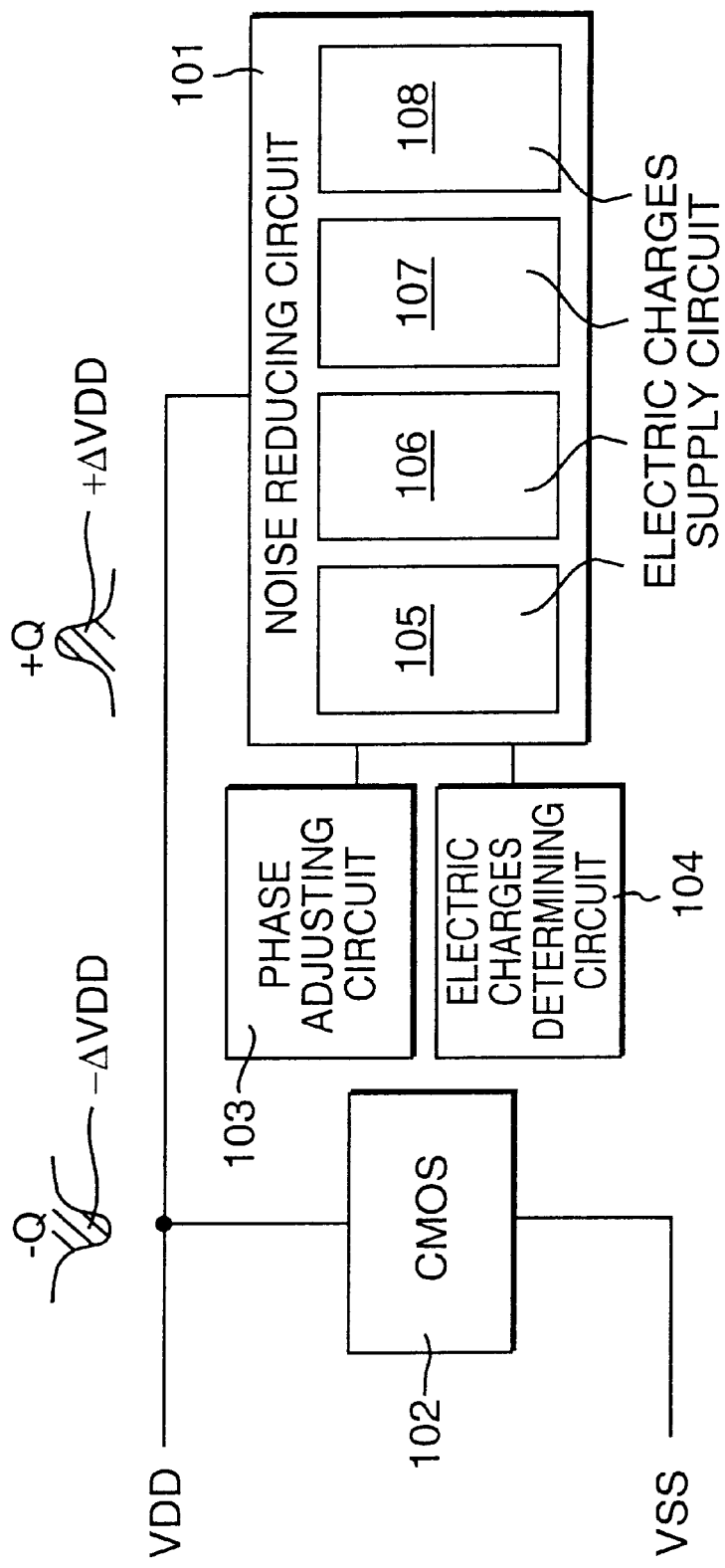
FIG. 1 is a circuit diagram showing a configuration of a low noise integrated circuit of the present invention.

FIG. 1 shows a configuration of a low noise integrated circuit device of the present invention. An integrated circuit 102 is a CMOS (Complementary Metal Oxide Silicon) integrated circuit, wherein a power supply current flows only when the integrated circuit switches itself. The circuit 102 receives a power supply from a positive power supply VDD (hereinafter, VDD0 and a negative power supply (hereinafter, VSS0. A noise on LSI power supply nets is generated by flowing of a power supply current of the circuit 102 from VDD to VSS. To simplify the description, consider a noise $\Delta$VDD occurring on the side of VDD. A noise reducing circuit 101 has electric charges supply circuits 105 to 108 and supplies electric charges to VDD. The electric charges supply circuit 105 supplies electric charges of q1=q0 to VDD, the supply circuit 106 supplies electric charges of q2=q0 to VDD, the supply circuit 107 supplies electric charges of q3=4•q0 to VDD and the supply circuit 108 supplies electric charges of q4=8•q0 to VDD, when respectively activated. The noise reducing circuit 101 can regulate an amount of electric charges supplied to VDD in one charge steps of q0 from q0 to 15•q0 based upon the combination of the electric charges supply circuits 105 to 108 that are activated. Assuming that a noise on LSI power supply nets of –$\Delta$VDD is generated because an amount of electric charge of Q at VDD becomes short according to an operation of the integrated circuit 102, then the electric charges determining circuit 104 determines the combination of the electric charges supply circuits 105 to 108 required to be activated to supply a corresponding amount of electric charges of Q of VDD and transfers a control signal to the noise reducing circuit 101. A phase adjusting circuit 103 synchronizes a time of supplying the amount of electric charges of Q to VDD by the noise reducing circuit 101 with the time that the noise –$\Delta$VDD occurs, thereby generating a noise +$\Delta$VDD for suppressing the noise –$\Delta$VDD based upon electric charges Q output from the noise reducing circuit 101 and to thereby suppress the noise.

In other words, according to the embodiment of the present invention, a noise on LSI power supply nets can be reduced by adding a noise of a reversed polar to the noise on the LSI power supply nets that occurred in VDD and thereby suppressing the noise. Electric charges supply timing regulated by the phase adjusting circuit 103 and an amount of electric charges determined by the electric charges determining circuit 104 can be further determined by a circuit simulation including a power supply wiring or a noise measurement on LSI power supply nets (measurement of an amplitude value and its peak time & time width) according to a high frequency wave probe.

Moreover, if a periodical characteristic is acknowledged as occurring in a noise as a result of the simulation and/or the measurement, at least the phase adjusting circuit is unnecessary because a future occurrence of the noise is predictable.

While reduction of a noise on LSI power supply nets that have occurred in the VDD is described, reduction of a noise on LSI power supply nets occurred in the VSS can be done by a corresponding electric charges supply circuit supplying negative electric charges to the VSS.

Figure 2A:
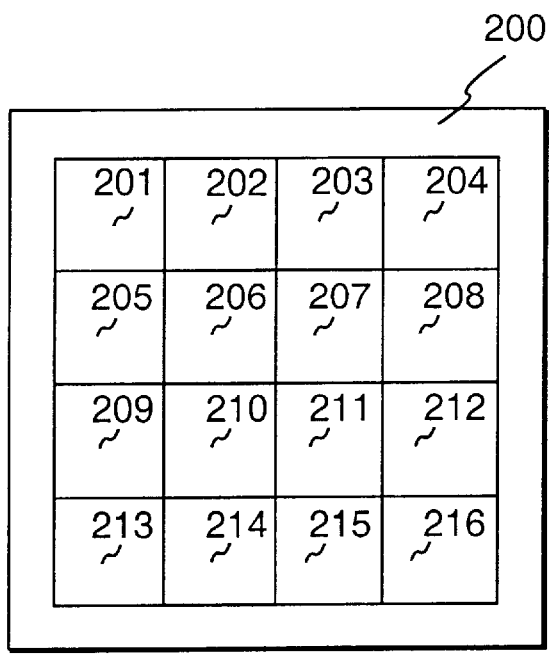
FIG. 2A is a semiconductor chip layout of a plurality of low noise integrated circuits according to any of the circuits of the present invention.
Figure 2B:
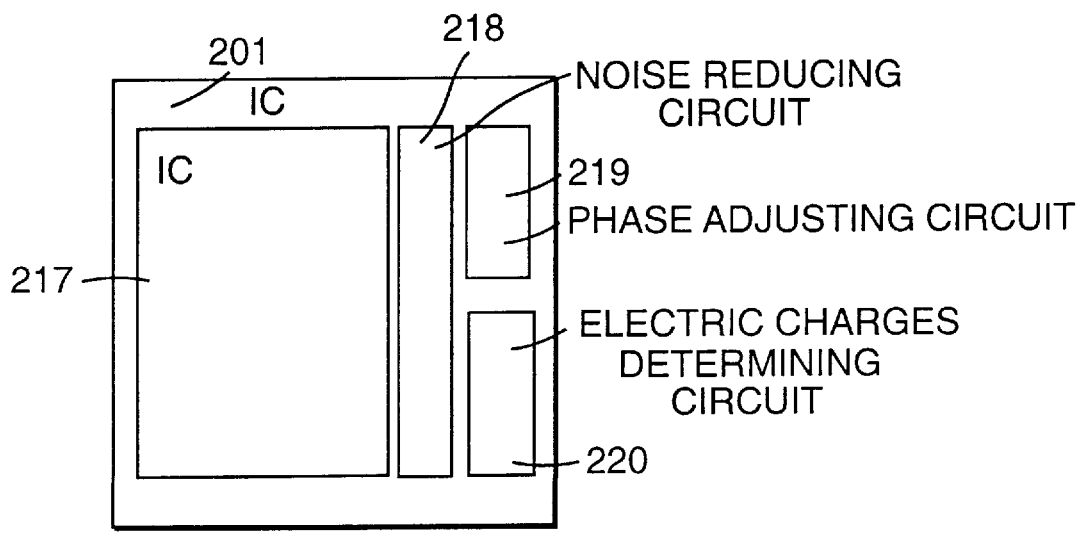
FIG. 2B is an enlarged circuit chip layout of the FIG. 1 low noise integrated circuit device.

FIG. 2A shows a semiconductor chip 200 including integrated circuits 201 to 216. Each integrated circuit 201 through 216 has the same circuit configuration of FIG. 1 including a CMOS integrated circuit 217, a noise reducing circuit 218, a phase adjusting circuit 219 and electric charges determining circuit 220, as shown in FIG. 2B. The noise reducing circuit 218 supplies an amount of electric charges determined by the electric charges determining circuit 220 to the CMOS integrated circuit 217 at a time determined by the phase adjusting circuit 219.

When a chip area of the chip 200 becomes large and an operation speed of an integrated circuit is improved, a noise on LSI power supply nets that occurred in the chip 200 has a characteristics of a local occurrence.

Figure 13:
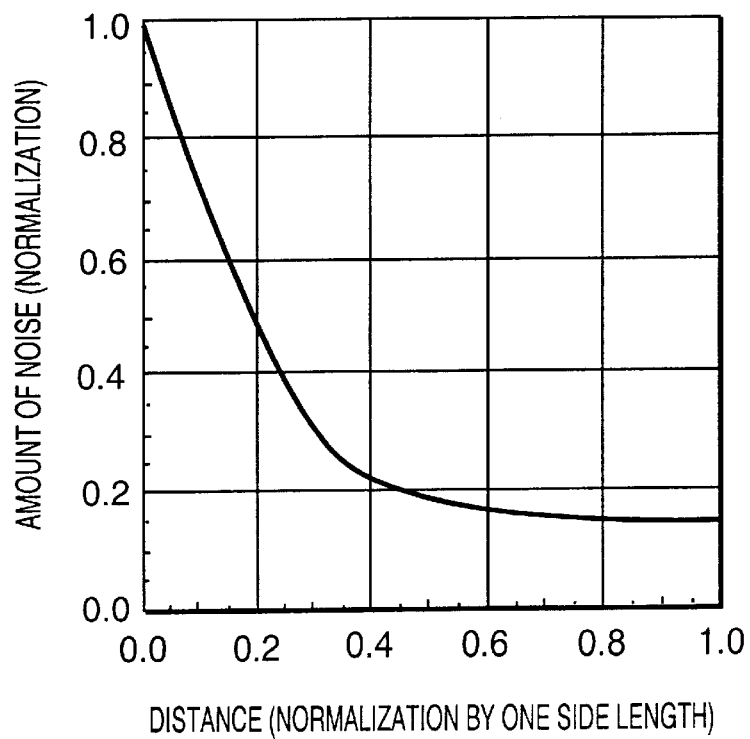
FIG. 13 is a graph showing a propagation of a noise on LSI power supply nets in the semiconductor chip applicable to all the circuits of the present invention.

FIG. 13 shows an example noise propagation on LSI power supply nets in a semiconductor chip with the Y axis indicating a normalized amount of noise at peak value and the X axis indicating a distance normalized by one side length of the chip. This figure shows that a noise that occurred on LSI power supply nets in the integrated circuit 201 diminishes by a half amount of the noise after propagates to an area of an adjacent integrated circuit 202 and that the noise rarely propagates to a further area of an integrated circuit 204.

In other words, it is desirable for a noise that occurred locally in a respective area of the chip to be reduced for the respective area.

According to the present invention, since pluralities of noise reducing circuits are placed dispersively in the chip 200 corresponding to a CMOS integration of the respective integrated circuits, electric charges for the local integrated circuit producing the noise can be supplied locally and a noise on LSI power supply nets in the chip 200 can be reduced.

Figure 3:
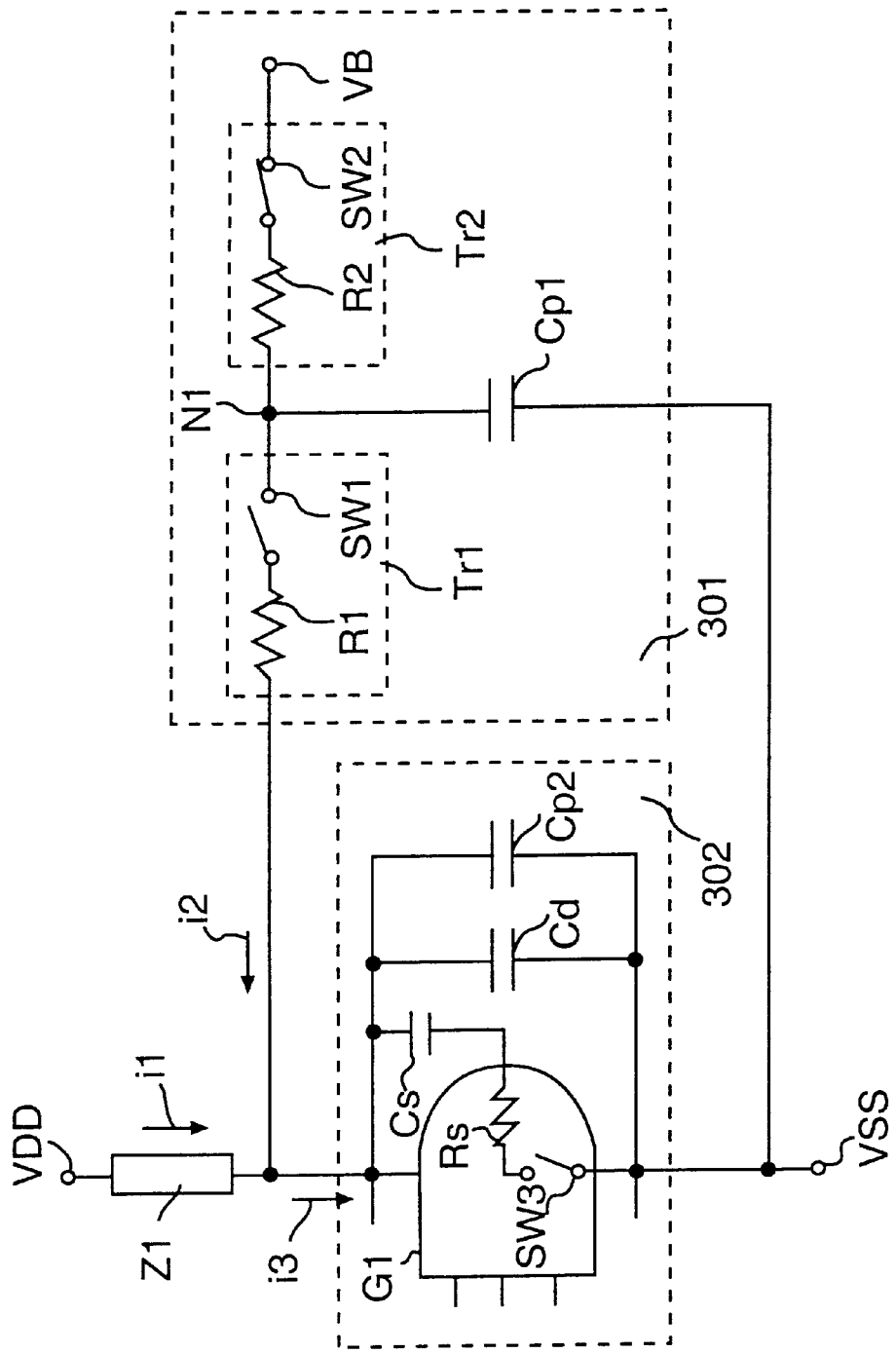
FIG. 3 is a circuit diagram based upon a second embodiment of the present invention.

FIG. 3 shows a second embodiment of the present invention. Based upon this embodiment, an effect of noise reduction equivalent to a bypass condenser having a large capacity can be obtained by using a bypass condenser having a small capacity.

FIG. 3 shows a configuration of a noise reducing circuit 301 and a CMOS integrated circuit 302 (hereinafter, integrated circuit) that is the object of a noise reduction. The noise reducing circuit 301 includes a condenser Cp1, MOS transistors Tr1, Tr2 and a bias voltage VB. The transistors Tr1 and Tr2 perform turn-on and off exclusively to charge or discharge the condenser Cp1 through resistors R1 and R2, respectively. The transistors Tr1 and Tr2 are equivalently represented by switches SW1, SW2 and turn-on resistors R1, R2. The integrated circuit 302 includes a gate G1, a load capacitor Cs and a capacitor Cd. When a switch SW3 of the gate G1 is turned off, power supply current of the integrated circuit flows into the capacitor Cd to be charged. The gate G1 is represented equivalently by the switch SW3 and a turn-on resistor Rs. A Cp2 represents a bypass condenser. Cs and Rs have their respective values varied corresponding to the change of the number of simultaneous switching circuits. However, a product of Rs times Cs is kept constant.

Current required to operate the integrated circuit 302 is supplied by matching a time constant of the product of Rs times Cs with a time constant of a product of R1 times Cp1. The power supply wiring (e.g., a power supply bump) for the integrated circuit 302 has impedance Z1. To simplify, consider only an impedance on the side of positive power supply VDD, since an impedance included in the power supply wiring on the side of a negative power supply VSS can be ignored because of its small value. In an equation i3=i1+i2, current applied to the integrated circuit 302 from VDD to Z1 is represented by i1, current flowing through the noise reducing circuit 301 is represented by i2 and power supply current of the integrated circuit 302 is represented by i3. A voltage potential at a connection point N1 is represented by VN1.

Figure 4:
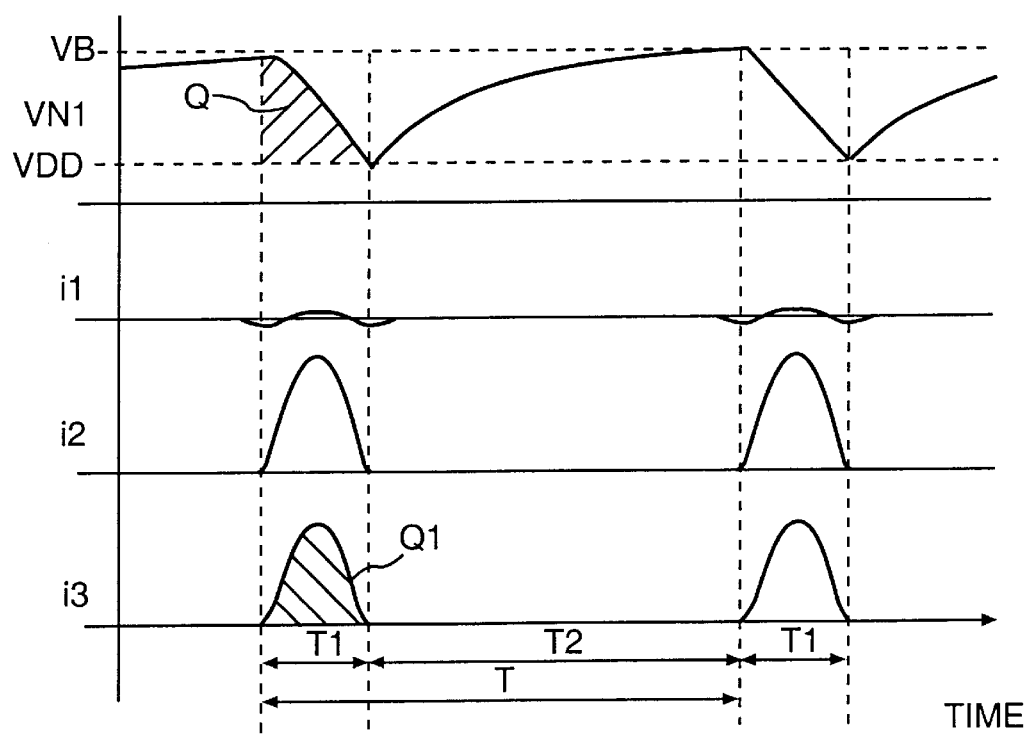
FIG. 4 is a timing chart showing an operation of the present invention.

FIG. 4 shows an operation of the present invention. The power supply current i3 of the integrated circuit 302 is a pulse current representing a repetitive pulse, with a period T, a current flowing period T1 and a non-current flowing period T2. An amount of electric charges applied to the integrated circuit 302 during the period T1 is represented by Q1. While the noise reducing circuit 301 turns SW1 on during the period T1 and turns SW1 off during the period T2, the noise reducing circuit 301 turns SW2 off during the period T1 and turns SW2 on during the period T2. Based upon this switching operation, the condenser Cp1 is charged by the bias voltage VB through the turn-on resistor R2 during the period T2 and electric charges of Cp1•VB is accumulated in the condenser Cp1. The power supply current i3 of the integrated circuit 302 flows only when the circuit switches itself and the relation of T1, T2 is T1<<T2. A noise of LSI power supply nets caused by an inductance included in a wiring from the bias voltage VB to the connection point N1 can be restricted by charging the condenser Cp1 with the time constant of R2•Cp1 during the period T2. A noise on LSI power supply nets caused by Z1 is reduced by discharging electric charges of Q=Cp1 (VB−VDD) during the period T1 through resistor R1 and bypassing the power supply current i3 of the integrated circuit 302. A value of the bias voltage VB is set so that Q≅Q1. The noise reducing circuit 301 can be set selectively and arbitrarily to an amount of electric charges being bypassed by varying voltage VB, e.g., with a phase adjusting circuit 103 and/or an electric charges determining circuit 104 of FIG. 1 or a noise measuring circuit 803 of FIG. 8.

Accordingly, a supply of electric charges having the same amount as connecting a bypass condenser having a large capacity can be achieved by setting the bias voltage VB high no matter how small the capacity of Cp1.

Figure 5A:
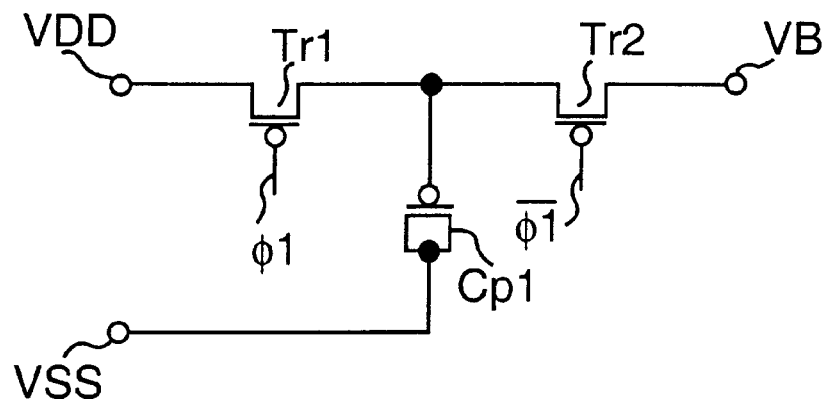
FIG. 5A is a circuit diagram based upon FIG. 3.
Figure 5B:
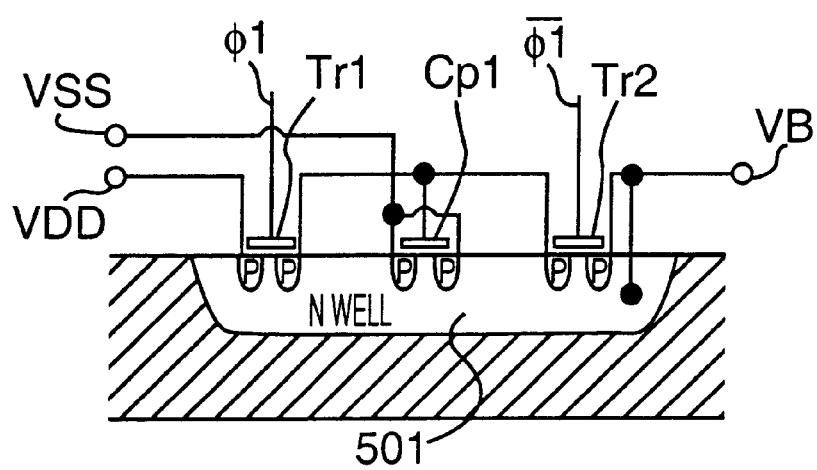
FIG. 5B is a sectional view of the circuit in FIG. 5A.

FIG. 5A shows a circuit diagram configuring a noise reducing circuit 301 with P type MOS transistors and FIG. 5B shows a sectional view of the noise reducing circuit 301. A condenser Cp1 is realized by using a P type MOS transistor. $\phi 1$ and $\phi 1$ bar represent signals to control transistors Tr1 and Tr2. When $\phi 1$ is high, transistor Tr1 is off, transistor Tr2 is on and the condenser Cp1 is charged. When $\phi 1$ is low, Tr1 transistor is on, Tr2 transistor is off and the condenser Cp1 is discharged. N well 501 of transistor Tr1, transistor Tr2 and condenser Cp1 prevents a current leakage from a drain or a source of transistor Tr1, transistor Tr2 and condenser Cp1 to the N well 501 by supplying electric charges from VB. It is possible to charge Cp1 with a voltage VB higher than VDD and to accumulate a large amount of electric charges when making VB large.

An effect of the noise reducing circuit 301 is now compared with the conventional bypass condenser and is described quantitatively. More concretely, a capacity required to reduce a noise on LSI power supply nets of $\Delta V$ by a half is acquired respectively for the conventional bypass condenser and a noise reducing circuit based upon the present invention, and both are compared. In FIG. 3, if an inductance of a power supply wiring has an infinite value and a bypass condenser Cp2 is not provided, a noise on LSI power supply nets $\Delta V$ occurred by turn-on and off of switch SW3 is given as an equation (2).

$$\Delta V = Cs \cdot VD/(Cd+Cs) \tag{2}$$

A condenser Cp2 required to reduce this $\Delta V$ by a half is given as an equation (3).

$$Cp2 = Cd + Cs \tag{3}$$

On the other hand, if a noise reducing circuit 301 is applied, a condenser Cp1 required to reduce the noise by a half is given as an equation (4).

$$Cp1 = Cs \cdot VDD/2(VB-VDD+\Delta V/2) \tag{4}$$

A noise reducing circuit 301 using bypass condenser Cp1 and condenser Cp2 has the same noise reduction effect. Since an effect of the noise reducing circuit 301 can be considered as a ration of Cp1 and Cp2 (set m), then m is defined as follows:

$$m = Cp2/Cp1 \tag{5}$$

When substituting the equation (3) based on the equation (2) and the equation (4) into the equation (5), an equation (6) is produced.

$$m = 2(VD/VDD) + \Delta V/VDD) - 2/(\Delta V/VDD) \tag{6}$$

A case to reduce a noise on LSI power supply nets of 10% of a power supply voltage VDD to 5% of VDD (that is reduced by one half) is considered. When VB is set to be 1.5·VDD, m=11 is provided. When VB is set to be 2·VDD, m=21 is provided. The noise reducing circuit 301 can reduce noise on LSI power supply nets by a half with a capacity of approximately 1/10 to 1/20 the conventional bypass condenser by providing a noise reducing circuit power supply voltage VB that is from 1.5 to 2 times the supply voltage VDD of the integrated circuit causing the noise.

In other words, by using the noise reducing circuit based upon the present invention, an equivalent noise reduction effect can be acquired with a capacity being small by 1 digit when compared to the conventional bypass condenser.

Figure 6A:
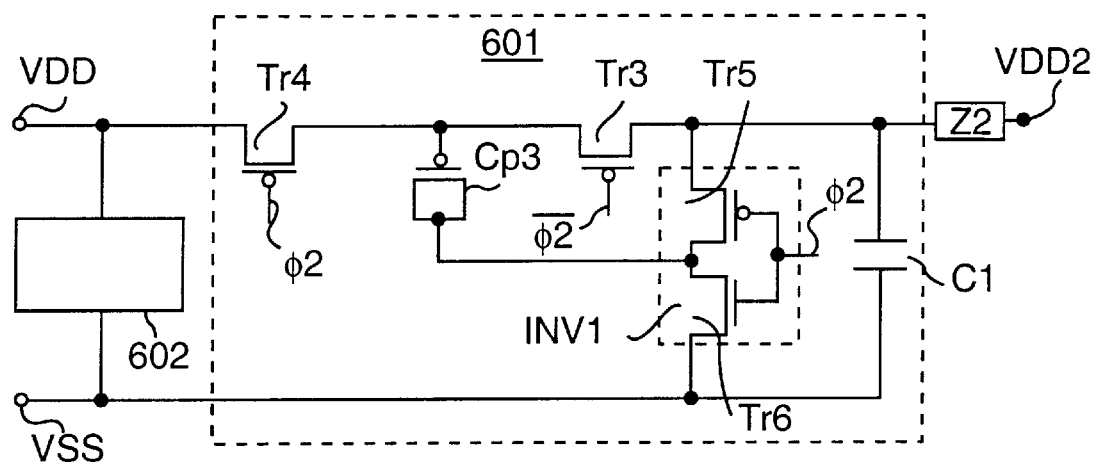
FIG. 6A is a circuit diagram embodied for VDD based upon the present invention.
Figure 6B:
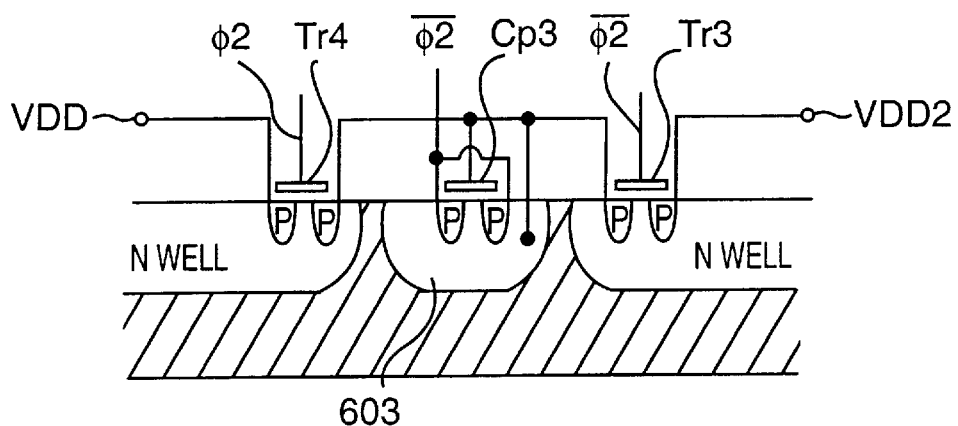
FIG. 6B is a sectional view of the circuit in FIG. 6A.

FIGS. 6A and 6B show a noise reduction circuit driven by one kind of a power supply voltage, specifically a positive voltage. FIG. 6A shows a noise reducing circuit 601 including P type MOS transistors Tr3, Tr4, Tr5, N type MOS transistor Tr6, a condenser Cp3 utilizing the P type MOS transistor and a condenser C1. The transistors Tr5 and Tr6 configure an inverter INV1. $\phi 2$ and $\phi 2$ bar represent a control signal of the noise reducing circuit 601 that have been obtained from a noise determining circuit. An integrated CMOS circuit 602 is the object of a noise reduction and receives a power supply from a positive power supply VDD and a negative power supply VSS. The condensers C1 and Cp3 charge from a power supply VDD2, through power supply wiring that has an impedance Z2. VDD2 has the same voltage as VDD. A value of Z2 is set for a time required to charge condensers C1 and Cp3 to be shorter than a flowing time interval of a power supply current of the integrated circuit 602.

In other words, although a wiring of VDD and VSS supplying electric charges mainly to the integrated circuit 602 requires a noise on LSI power supply nets to be reduced by decreasing an impedance of the wiring of VDD and VSS as much as possible, a wiring from VDD2 to condenser C1 is not required to have the same low impedance as the impedance of the wiring of VDD and VSS.

When $\phi 2$ is high, transistor Tr3 is on, transistor Tr4 is off, inverter INV1 output is low and condensers C1, Cp3 are charged by a voltage of (VDD2−VSS). During a period that a power supply current of the integrated circuit 602 flows, when setting $\phi 2$ low, transistor Tr3 is off, transistor Tr4 is ion and inverter INV1 output is high. At this moment, a current path connected from VDD to transistor Tr4, condenser Cp3, transistor Tr5, condenser C1 and VSS is generated. Simultaneously, condenser C1 and condenser Cp3 discharge electric charges charged during a period that $\phi 2$ is high and supply the electric charges to the integrated circuit 602.

In other words, a condition that charged a serial circuit of condensers C1 and Cp3 with twice a voltage of (VDD2−VSS is realized by changing a parallel connection of condensers C1 and Cp3 during a period that $\phi 2$ is high to a serial connection of condensers C1 and Cp3 during a period that $\phi 2$ is low.

FIG. 6B shows a sectional view of transistors Tr3, Tr4 and condenser Cp3 of the noise reducing circuit 601. Since the condenser Cp3 gate becomes the highest voltage potential in the noise reducing circuit 601 as a result of a serial connection of condensers C1 and Cp3, N well 603 of condenser Cp3 is required to be the same voltage potential as a condenser Cp3 gate because of a leakage current prevention. However, when condenser Cp3 discharged electric charges completely, a voltage between a gate and a source of condenser Cp3 become zero voltage. At the moment transistors Tr3 and Tr6 are set on to charge condenser Cp3 again, a voltage potential of the gate, the drain, the source and N well of condenser Cp3 goes down to an intermediate level of VDD and VSS. Other transistors and wells are isolated as shown in FIG. 6B so as not to transfer or leak this voltage drop to the surrounding transistors. According to this isolation, a leakage current from the surrounding transistors can be prevented even if a voltage potential of N well of condenser Cp3 goes down.

If VDD2=VDD and C1=Cp3=½·Cp1, the fourth embodiment accords with a case that charges a condenser of ¼·Cp1 with voltage VB being twice a voltage of VDD based. Then, m=5 according to the equation (6) and a noise reduction effect five times a bypass condenser having a capacity of (C1+Cp3) can be provided.

Figure 7A:
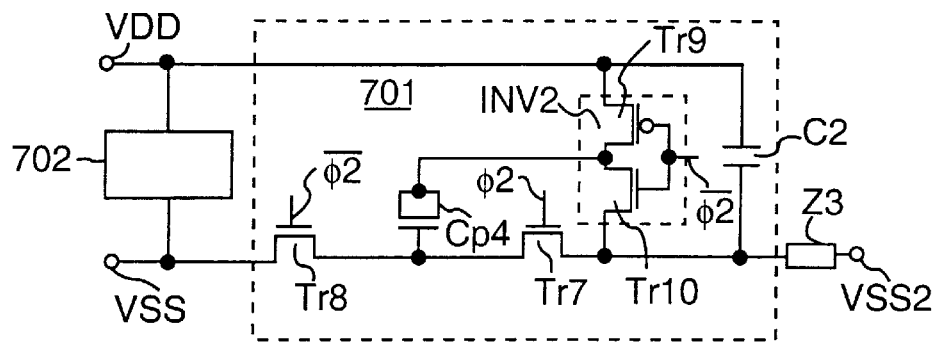
FIG. 7A is a circuit diagram embodied for VSS based upon the present invention and otherwise similar to FIG. 6A.
Figure 7B:
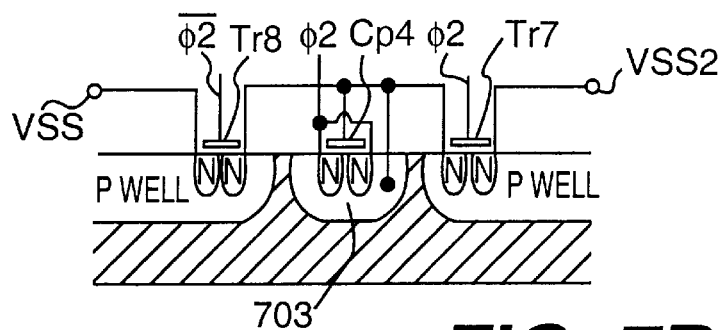
FIG. 7B is a sectional view of the circuit in FIG. 7A.

While the noise reducing circuit for VDD is described, it is possible to embody a noise reducing circuit for VSS as shown in FIGS. 7A and 7B. FIG. 7A shows a noise reducing circuit 701 including N type MOS transistors Tr7, Tr8, Tr10, a P type MOS transistor Tr9, a condenser Cp4 utilizing an N type MOS transistor, and a condenser C2. Transistors Tr9 and Tr10 are configured as an inverter INV2. When $\phi 2$ is high, an output of inverter INV2 is high, transistor Tr7 is on and transistor Tr8 is off. Condensers C2 and Cp4 are connected via a power supply voltage VSS2 and an impedance Z3 of a power supply wiring, and charged by a voltage of (VDD−VSS2). A voltage VSS is set identical to that of voltage VSS2. A value of impedance Z3 is set for a time required to charge condensers C2 and Cp4 to be shorter than a flowing time interval of a power supply current of the integrated circuit 702. When $\phi 2$ is low, an output of inverter INV2 is low, transistor Tr7 is off and transistor Tr8 is on. At this moment, a current path connected from voltage VSS to transistor Tr8, condenser Cp4, transistor Tr10, condenser C2 and voltage VDD is established. Simultaneously, condensers C2 and Cp4 discharge electric charges charged during a period that $\phi 2$ is high and supply the electric charges to an integrated circuit 702. FIG. 7B shows a sectional view of transistors Tr7, Tr8 and condenser Cp4 of the noise reducing circuit 701. While a P well 703 of condenser Cp4 has a same voltage potential as the condenser Cp4 gate, the P well 703 is isolated from a well of the surrounding transistor because a gate voltage potential is raised when charging condenser Cp4 based upon the same reason as stated for the noise reducing circuit 601. Therefore, a noise reducing circuit can be embodied for VSS. A noise on LSI power supply nets occurring in a positive and a negative power supply can be reduced by using the noise reducing circuits 601 and 701 together.

Figure 8:
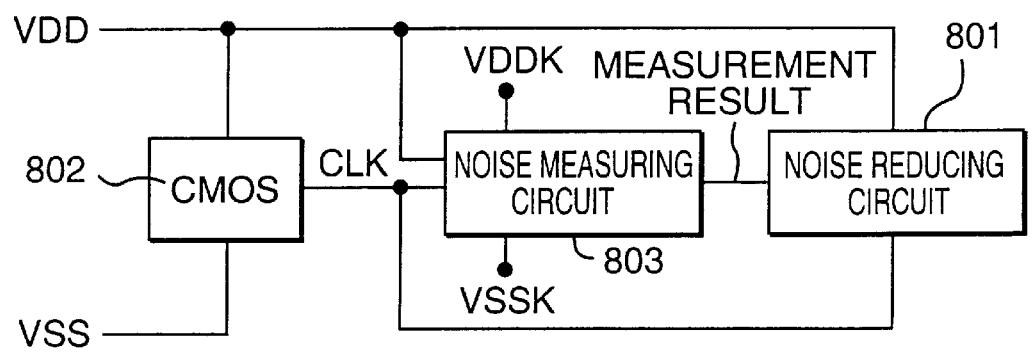
FIG. 8 is a circuit diagram showing a configuration of a low noise integrated circuit of the present invention that employs a clock.

FIG. 8 shows a block diagram of a low noise integrated circuit device that has a CMOS integrated circuit 802 that supplies a power from a positive power supply VDD and a negative power supply VSS, and a noise reducing circuit 801 supplying electric charges for the power supply VDD and being connected to the power supply VDD. A noise measuring circuit 803 is a circuit measuring an amount of a noise on LSI power supply nets of power supply VDD and the noise reducing circuit 801 supplies to the power supply VDD an amount of electric charges required to reduce a noise on LSI power supply nets after receiving the measuring result. A power supply of the noise measuring circuit 803 supplies electric charges from VDDK and VSSK having a different power supply wiring from VDD and VSS to avoid an influence of a noise on LSI power supply nets occurred in VDD.

The circuit of FIG. 8 is effective for reducing a noise that has an occurring time that is already known and a waveform of noise being generated that is kept constant for clock cycle, e.g., a noise on LSI power supply nets caused by a clock driver in particularly with respect to a CMOS integrated circuit.

For instance, as shown in FIG. 8, a CMOS integrated circuit 802 is an integrated circuit operated in synchronism with a clock signal and distributes a clock signal (CLK) to the noise measuring circuit 803 and the noise reducing circuit 801. A clock period is set tc. The noise measuring circuit 803 measures a noise on LSI power supply nets of VDD generated in synchronism with the clock signal at a time t=n·tc, where n is an integer. After the receipt of the measuring result, the noise reducing circuit 801 supplies a shortage of electric charges to power supply VDD of the CMOS integrated circuit 802. An amount of electric charges required to cancel the noise can be supplied to CMOS integrated circuit 802 because an amount of electric charges supplied by circuit 801 is determined while measuring the noise by circuit 803. A supply timing by circuit 801 is not drifted with respect to a timing of noise occurrence because the supply timing is controlled by the clock signal (CLK).

After measuring a noise at cycle n by using the noise measuring circuit 803, noise reduction on LSI power supply nets is achieved by using the measured value in the noise reducing circuit 801 at a next cycle (n+1)·tc of a clock cycle n·tc. Thus the noise reducing circuit 801 functions to predict noise generation.

Figure 9:
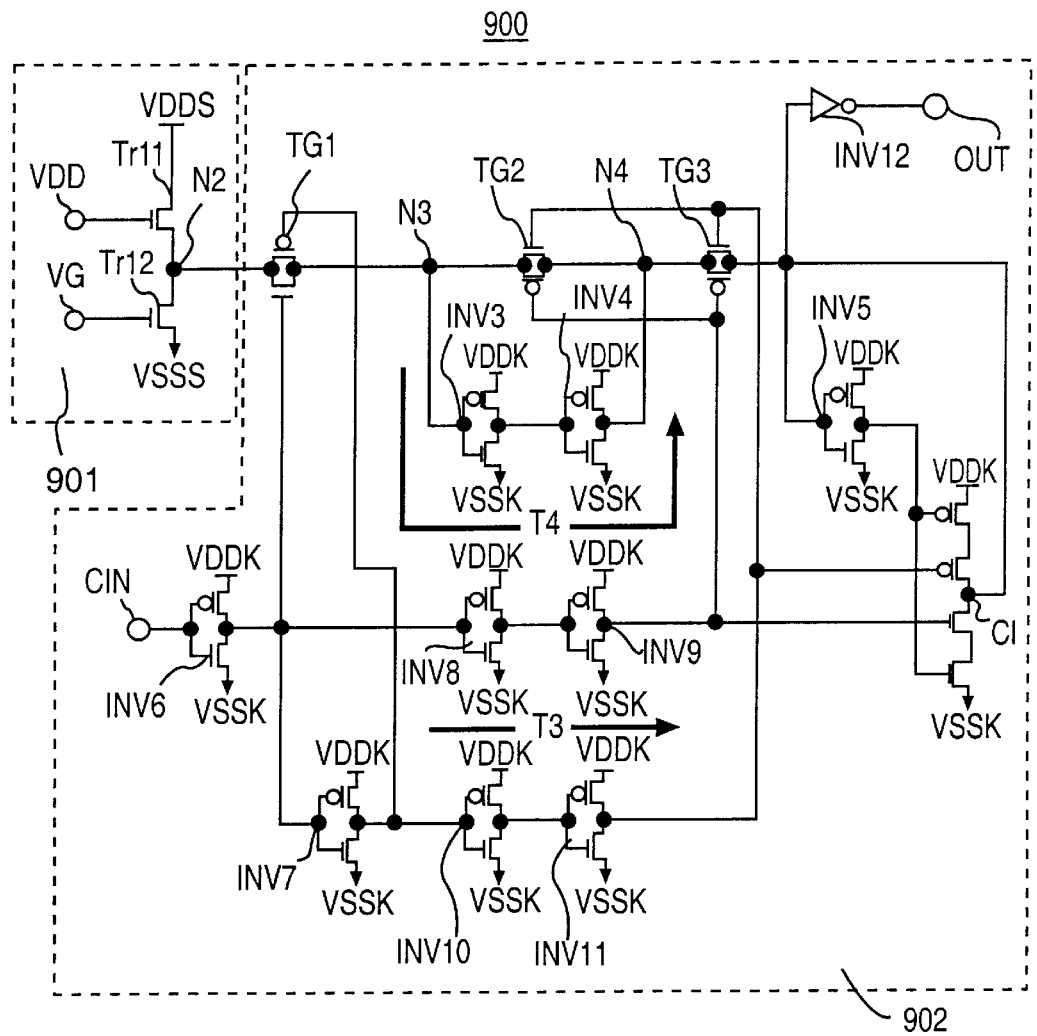
FIG. 9 is a circuit diagram showing a configuration for a noise measuring circuit based upon the present invention.

FIG. 9 shows a circuit diagram of a noise measuring CMOS circuit to measure an amplitude of a noise on LSI power supply nets. CI represents a clock inverter. A noise measuring circuit 900 includes a level shift circuit 901 having N type MOS transistors Tr11 and Tr12 and a flip-flop circuit 902 having transfer gates TG1, which measures a noise occurred in a power supply VDD. The level shift circuit 901 drops a DC voltage of a noise on LSI power supply nets of VDD. The level shift circuit 901 has positive power supply VDDS, and a negative power supply has VSSS. The flip-flop circuit 902 has positive power supply VDDK and negative power supply VSSK. These power supplies are isolated from a power supply generating a noise on LSI power supply nets and therefore, the noise measuring circuit 900 can prevent an influence of a noise on LSI power supply nets.

In the level shift circuit 901, transistor Tr11 functions as a source follower and transistor Tr12 functions as a load current source of the source follower. Voltage values of VDDS and VSSS are set to be VDDS≧VDD and VSS≧VSSS, respectively. If VSS>VSSS, a P well of transistor Tr12 is separated from a P well of the surrounding transistor and is required to supply electric charges from VSSS to avoid a short contact between VSSS and the P well of transistor Tr12. A gate of transistor Tr11 is connected to power supply VDD. A noise occurred in power supply VDD is transferred to a source of transistor Tr11. In other words, the noise occurred in power supply VDD is level-shifted by a voltage between a gate and a source of transistor Tr11. A gate of transistor Tr12 is connected to a bias voltage VG and a drain current of transistors Tr11 and Tr12 is varied by changing voltage VG. A voltage between a gate and a source of transistor Tr11 is varied by the change of the drain current of transistor Tr11. In other words, an amount of level shift voltage of power supply VDD can be controlled by the bias voltage VG. Based upon this level shift circuit, a DC voltage of a noise on LSI power supply nets of VDD shifts its noise level up to the vicinity of an average voltage between VDDK and VSSK.

A feature of flip-flop circuit 902 is to include a couple of a delay circuits having inverters INV8 and INV9, INV10 and INV11. FIG. 9 configures a master memory circuit of INV3, INV4, TG2 and a slave memory circuit of inverter INV5 and clock inverter CI. An inverter INV12 is provided for functioning as an output buffer. A control signal (CTL) controlling turn-on and off of clock inverter CI, transfer gates TG1, TG2 and TG3 is input from a terminal CIN. The control signal (CTL) is divided into an inverting signal and non-inverting signal by the inverters INV6 and INV7, and input to transfer gate TG1. The inverting signal is divided into transfer gates TG2, TG3 and clock inverter CI through inverters INV8 and INV9. In a same manner, the non-inverting signal is divided into transfer gates TG2, TG3 and clock inverter CI through inverters INV10 and INV11. A delay is generated between an inverting signal controlling transfer gate TG1 and an inverting signal controlling transfer gates TG2, TG3 and clock inverter CI based upon inverters INV8 and INV9. Another delay time T3 is generated between a non-inverting signal controlling transfer gate TG1 and a non-inverting signal controlling transfer gates TG2, TG3 and clock inverter CI based upon inverters INV10 and INV11. A time required to transfer an input signal from a connection point N3 to inverters INV3, INV4 and a connection point N4 is set as T4. The master memory circuit can memorize an input signal with transfer gate TG2 turned on by setting T3≧T4. If an amplitude of a signal input from a connection point N2 through transfer gate TG1 becomes small, the time T4 might become large depending on the characteristics of an inverter. In a same manner, the delay time T3 becomes large by increasing the number of inverter stages in the delay circuit.

Figure 10:
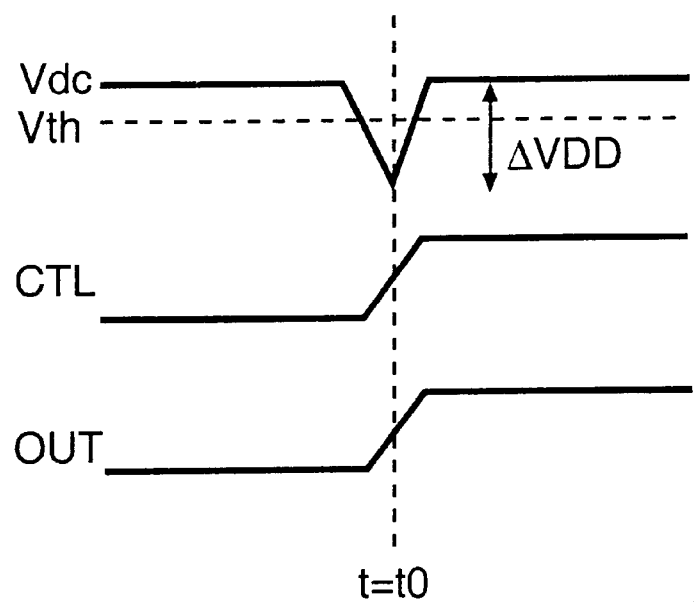
FIG. 10 is a timing chart showing an operation of the noise measuring circuit of FIG. 9.
Figure 11:
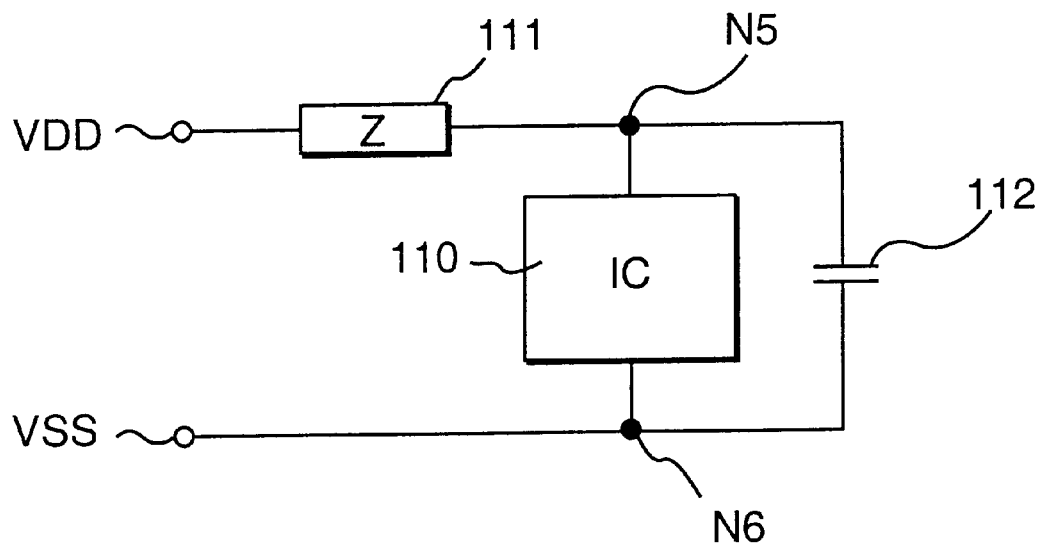
FIG. 11 is a circuit diagram showing a configuration of the prior art circuit.
Figure 12:
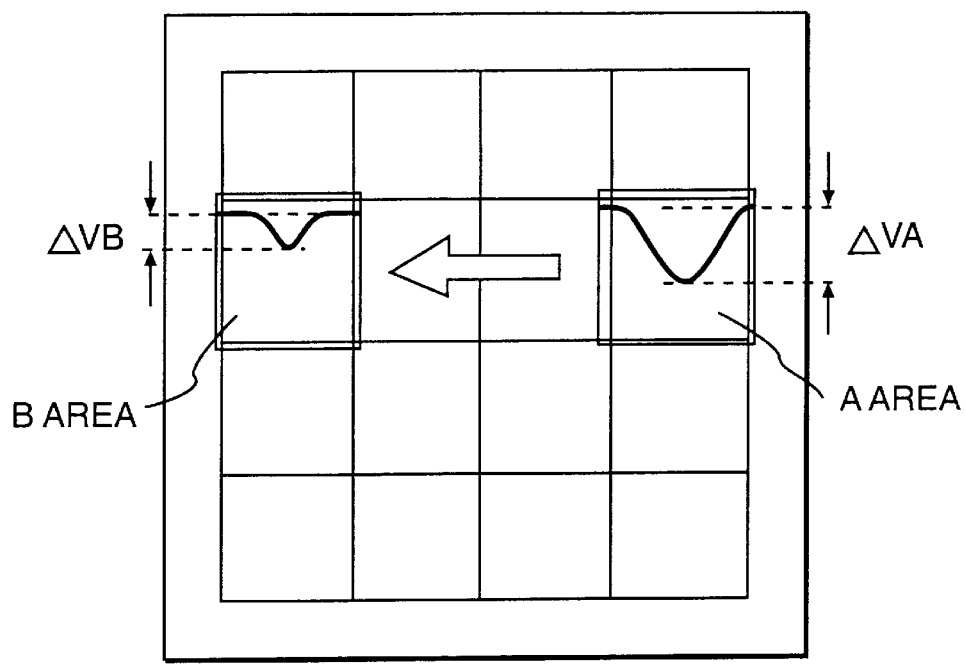
FIG. 12 is a chip layout showing the present invention analysis of a problem of the prior art.

FIG. 10 illustrates a method for measuring a noise with the circuit of FIG. 9. A noise voltage occurred in VDD is ΔVDD and a voltage at a connection point N2 is Vdc. In flip-flop circuit 902, a threshold voltage between a Vdc voltage at which the master memory circuit memorizes a high level and another Vdc voltage at which the master memory circuit memorizes a low level is represented by Vth. In other words, if Vdc>Vth, a low level is output at an OUT terminal when the control signal (CTL) is switched from a low level to a high level. If Vdc<Vth, a high level is output at OUT terminal when the control signal (CTL) is switched from a low level to a high level.

The noise ΔVDD is generated at t=t0 and the voltage Vdc has a voltage drop by ΔVDD. If Vth>(Vdc−ΔVDD) and the control signal (CTL) is switched from a low level to a high level at t=t0, an output signal at OUT terminal switches from a low level to a high level. If ΔVDD is small and Vth<(Vdc−ΔVDD), an out at OUT terminal is fixed to a low level. Accordingly, when an output at OUT terminal switches from a low level to a high level, ΔVDD becomes larger than a value (Vdc−Vth). An amplitude of ΔVDD can be measured by changing a direct current level of Vdc with the bias voltage VG and checking a large/small relation of ΔVDD and (Vdc−Vth).

When assuming the level shift circuit 901 as a source follower inputting VSS by using a P type MOS transistor, a noise on LSI power supply nets occurred in VSS can be measured because a power supply voltage of VSS can be raised.

Figure 14:
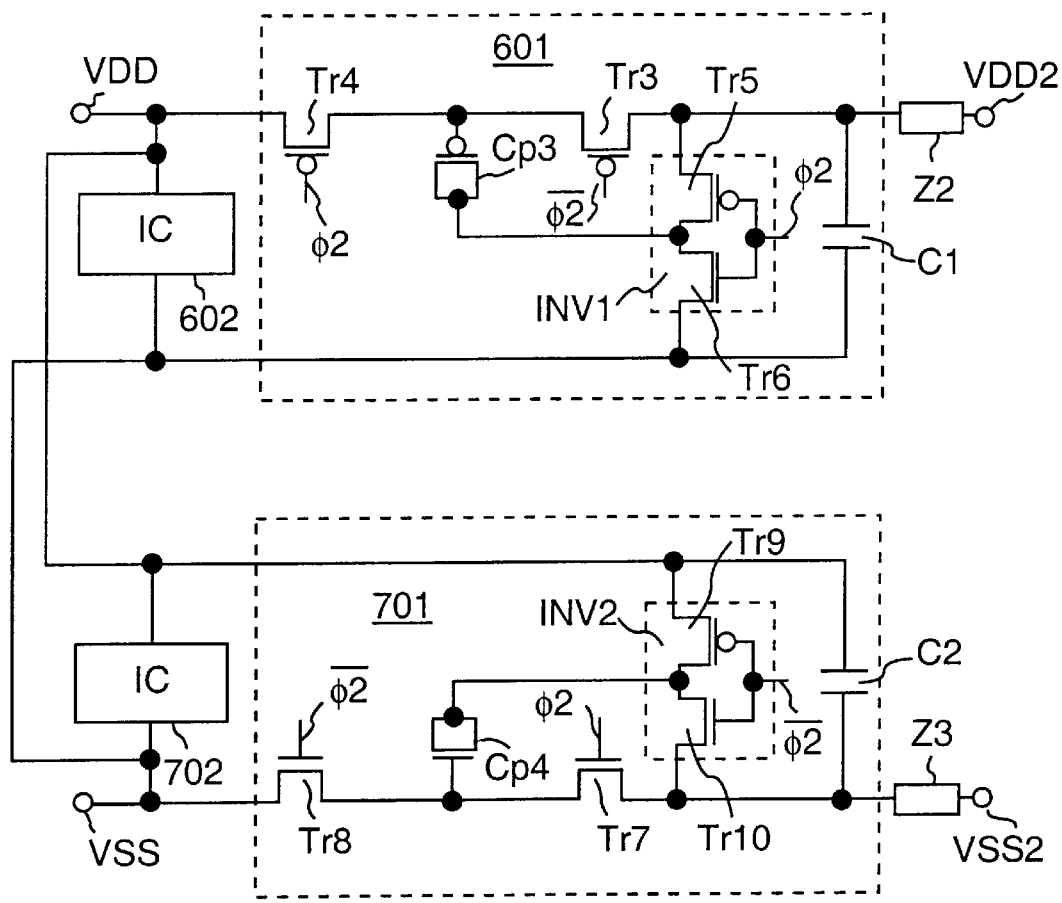
FIG. 14 is a circuit diagram embodied for VDD and VSS simultaneously by employing the circuits of both FIGS. 6A and 7A of the present invention.

A circuit shows in FIG. 14 is capable of reducing a noise on LSI power supply nets of VDD and VSS by combining the circuits in FIGS. 6 and 7.

According to the aforementioned, an effectiveness of the following is provided.

(e1) Since electric charges being short in an integrated circuit by a switching of the circuit can be supplied to the integrated circuit in response to a generating time of a noise on LSI power supply nets, an integrated circuit device reducing a noise on LSI power supply nets can be provided.

(e2) A generated noise on LSI power supply nets can be predicted and reduced.

(e3) A noise on LSI power supply nets generated locally in a semiconductor chip can be reduced and an amount of electric charges supplied to the integrated circuit by a noise reducing means can be easily regulated.

(e4) An amount of electric charges more than ten times a bypass condenser can be supplied to the integrated circuit because of discharging a condenser charged with a higher voltage than a power supply voltage of the integrated circuit.

(e5) Electric charges supply ability of five times a bypass condenser can be acquired even if one kind of a power supply voltage is used.

(e6) A noise on LSI power supply nets of a positive and a negative power supply of the integrated circuit can be reduced.

(e7) A condenser able to charge with a higher voltage than a power supply voltage of the integrated circuit can be realized by using a MOS type semiconductor.

(e8) A noise reducing circuit having the least leakage current can be realized by using a MOS type semiconductor.

(e9) An amount of electric charges supplied to the integrated circuit by the noise reducing circuit can be determined by measuring a noise occurred in the integrated circuit.

(e10) An amplitude of a noise on LSI power supply nets can be measured because a result comparing a noise voltage on LSI power supply nets with a designated voltage at a designated time can be acknowledged.

(e11) An influence of a noise on LSI power supply nets occurred in the integrated circuit to a noise measuring circuit can be reduced and a precision of a noise measuring circuit is improved because a power supply of the noise measuring circuit can be separated from that of the integrated circuit.

While a preferred embodiment of the present invention has been described in detail, with variations and modifications, further embodiments, variations and modifications are contemplated within the broader aspects of the present invention, in addition to the advantageous details, in accordance with the spirit and scope of the following claims.

What is claimed is:

1. A low noise integrated circuit device formed on a semiconductor chip, comprising:
    an integrated circuit having LSI power supply nets and being driven by a clock signal having a clock cycle;
    means for determining an amount of electric charges required to reduce noise generated by the power supply nets of said integrated circuit;
    means for adjusting a phase with reference to the clock cycle to supply said amount of electric charges to said integrated circuit; and
    noise reducing means on the LSI power supply nets for supplying the amount of electric charges at the adjusted phase to said integrated circuit in response to an amount of the noise generated by said power supply nets.

2. The low noise integrated circuit device according to claim 1, wherein said at least a noise reducing means on the LSI power supply nets is locally placed on the semiconductor chip to reduce the noise on the LSI power supply nets generated locally on the semiconductor chip.

3. A low noise integrated circuit device formed on a semiconductor chip, comprising:
    an integrated circuit having a positive LSI power supply nets and a negative LSI power supply nets and being being expressed by an equivalent circuit including a switch periodically turning on and a turn-on resistor;
    additional power supply nets separated from said positive power supply nets and said negative power supply nets; and
    at least a noise reducing means on the LSI power supply nets mounted on the semiconductor chip for reducing the noise on the LSI power supply nets of said integrated circuit,
    wherein said at least a noise reducing means on the LSI power supply nets includes a first switching means having a first terminal and a second terminal, a second switching means having a third terminal and a fourth terminal, and a capacitance means,
    wherein said first terminal is connected to said positive power supply nets of said integrated circuit, said second terminal is connected to said third terminal, said fourth terminal is connected to said additional power supply nets having a higher power supply voltage than said positive power supply, a connection point between said second terminal and said third terminal is connected to said negative power supply nets of said integrated circuit via said capacitance means, and
    wherein said first switching means turns on and off in synchronism with said switch and said second switching means turns on and off under a phase opposite to a phase of said switch so that said capacitance means is charged by turning-off said first switching means and turning-on said second switching means, and at least a part of electric charges charged in said capacitance means is supplied to said integrated circuit by turning-on said first switching means and turning-off said second switching means.

4. The low noise integrated circuit device according to claim 3, wherein said integrated circuit includes a CMOS circuits, and said capacitance means, said first switching means and said second switching means comprise a MOS type transistor having a well connected to said first power supply nets.

5. A low noise integrated circuit device formed on a semiconductor chip, comprising:
    an integrated circuit having a positive LSI power supply nets and a negative LSI power supply nets and being being expressed by an equivalent circuit including a switch periodically turning on and a turn-on resistor;
    additional power supply nets separated from said positive power supply nets and said negative power supply nets; and
    at least a noise reducing means on the LSI power supply nets mounted on the semiconductor chip for reducing the noise on the LSI power supply nets of said integrated circuit,
    wherein said at least a noise reducing means on the LSI power supply nets includes a first switching means having a first terminal and a second terminal, a second switching means having a third terminal and a fourth terminal, a third switching means having a fifth terminal and a sixth terminal, a fourth switching means having a seventh terminal and an eighth terminal, a first capacitance means and a second capacitance means,
    wherein said first terminal is connected to said positive power supply of said integrated circuit, said second terminal is connected to said third terminal, said fourth terminal is connected to said fifth terminal, said sixth terminal is connected to said seventh terminal, a connection point between said fourth terminal and said fifth terminal is connected to said additional power supply, a connection point between said second terminal and said third terminal is connected to a connection point between said sixth terminal and said seventh termial via said first capacitance means, said eighth terminal is connected to said negative power supply of said integrated circuit and said first power supply is connected to said negative power supply via said second capacitance means, wherein said first and third switching means turn on and off in synchronism with said switch and said second and fourth turn on and off under a phase opposite to a phase of said switch so that said first capacitance means is charged by turning-of said first switching means, turning-on said second switching means, turning-off said third switching means and turning-on said fourth switching means, and that at least a part of electric charges charged in said first capacitance means and said second capacitance means is supplied to said integrated circuit by turning-on said first switching means, turning-off said second switching means, turning-on said third switching means and turning-off said fourth switching means.

6. The low noise integrated circuit device according to claim 5, wherein said integrated circuit includes a CMOS circuits, and said first capacitance means comprises a MOS type transistor having a well separated from another well of the surrounding transistors.

7. A low noise integrated circuit device formed on a semiconductor chip, comprising:

an integrated circuit having a positive LSI power supply nets and a negative LSI power supply nets and being being expressed by an equivalent circuit including a switch periodically turning on and a turn-on resistor;

additional power supply nets and a second power supply nets separated from said positive power supply nets and said negative power supply nets; and at least a noise reducing means on the LSI power supply nets mounted on the semiconductor chip for reducing the noise on the LSI power supply nets of said integrated circuit, wherein said at least a noise reducing means on the LSI power supply nets includes a first switching means having a first terminal and a second terminal, a second switching means having a third terminal and a fourth terminal, a third switching means having a fifth terminal and a sixth terminal, a fourth switching means having a seventh terminal and an eighth terminal, a first capacitance means, a fifth switching means having a ninth terminal and a tenth terminal, a sixth switching means having an eleventh terminal and a twelfth terminal, a seventh switching means having a thirteenth terminal and a fourteenth terminal, an eighth switching means having a fifteenth terminal and a sixteenth terminal, a second capacitance means, a third capacitance means and a fourth capacitance means, wherein said first terminal is connected to said positive power supply nets of said integrated circuit, said second terminal is connected to said third terminal, said fourth terminal is connected to said fifth terminal, said sixth terminal is connected to said seventh terminal, a connection point between said fourth terminal and said fifth terminal is connected to said additional power supply nets, a connection point between said second terminal and said third terminal is connected to a connection point between said sixth terminal and said seventh terminal via said first capacitance means, said eighth terminal is connected to said negative power supply nets, said ninth terminal is connected to said negative power supply nets of said integrated circuit, said tenth terminal is connected to said eleventh terminal, said twelfth terminal is connected to said thirteenth termial, said fourteenth terminal is connected to said fifteenth terminal, a connection point between said twelfth terminal and said thirteenth terminal is connected to said second power supply nets, a connection point between said tenth terminal and said eleventh termial is connected to a connection point between said fourteenth terminal and said fifteenth terminal via said second capacitance means, said sixteenth terminal is connected to said positive power supply nets, said first power supply nets is connected to said negative power supply nets via said third capacitance means and said second power supply nets is connected to said positive power supply nets via said fourth capacitance means, wherein said first, third, fifth and seventh switching means turn on and off in synchronism with said switch and said second, fourth, sixth and eighth switching means turn on and off under opposite phase of said switch so that said first capacitance means and said second capacitance means are charged by turning-off said first switching means, turning-on said second switching means, turning-off said third switching means, turning-on said fourth switching means, turning-off said fifth switching means, turning-on said sixth switching means, turning-off said seventh switching means and turning-on said eight switching means, and that at least a part of electric charges charged in said first capacitance means, said second capacitance means, said third capacitance means and said fourth capacitance means is supplied to said integrated circuit by turning-on said first switching means, turning-off said second switching means, turning-on said third switching means, turning-off said fourth switching means, turning-on said fifth switching means, turning-off said sixth switching means, turning-on said seventh switching means and turning-off said eight switching means.

8. The low noise integrated circuit device according to claim 7, wherein said integrated circuit includes a CMOS circuits, and said first capacitance means and said second capacitance means comprise a MOS type transistor having a well separated from another well of the surrounding transistors.

9. A low noise integrated circuit device formed on a semiconductor chip, comprising:

an integrated circuit having a LSI power supply nets, wherein said integrated circuit has devices causing noise on the LSI power supply nets which occurs in synchronism with a clock signal;

means for measuring the noise on the LSI power supply nets of said integrated circuit in synchronism with one clock of said clock signal supplied by said integrated circuit; and a noise reducing means on the LSI power supply nets for supplying an amount of electric charges required to operate said integrated circuit at every clock of said clock signal after said amount of required electric charge is set to the noise reducing means in response to an amount of the noise measured by said means for measuring the noise.

10. A low noise integrated circuit device for a semiconductor chip, comprising:

an integrated circuit having a LSI power supply nets and being mounted on the semiconductor chip;

means for measuring the noise on the LSI power supply nets of said integrated circuit in synchronism with a clock signal supplied by said integrated circuit; and a noise reducing means on the LSI power supply nets for supplying an amount of electric charges required to operate said integrated circuit in response to an amount of the noise measured by said means for measuring the noise, wherein said means for measuring the noise on the LSI power supply nets includes a voltage converting means for converting DC voltage of the noise on the LSI power supply nets in said integrated circuit, a first switching means, a second switching means, a first memory circuit looping around said second switching means, a first inverter, a second inverter, a third switching means, a fourth switching means and a second memory circuit looping around said fourth switching means, a third inverter and a fourth inverter, wherein a serially connected circuit is provided so that a signal is transmitted to said first memory circuit, said second switching means and said second memory circuit via said voltage converting means and said first switching means, wherein after a designated delay time (T3), which is not shorter than a total delay time of said first inverter and said second inverter, by switching said first switching means from turning-on to turning-off, the noise on the LSI power supply nets occurring in said integrated circuit is measured by switching said second switching means, said third switching means from turning-off to turning-on and by switching said fourth switching means from turning-on to turning-off.

* * * * *